US012720710B2

(12) United States Patent
Diaz Marin et al.

(10) Patent No.: US 12,720,710 B2
(45) Date of Patent: Aug. 25, 2026

(54) PERFORMANCE IN TWO-PHASE COOLING SYSTEMS

(71) Applicant: Intel Corporation, Santa Clara, CA (US)

(72) Inventors: Jose Diaz Marin, San Jose (CR); Fabian Garita Gonzalez, San Rafael (CR); Jose Andres Santamaria Cordero, Cartago (CR); Ronald Jose Loaiza Baldares, Cartago (CR); Manfred Humberto Hernandez Calderon, Ciruelas (CR); Ruander Cardenas, Portland, OR (US); Sofía Solís Loáiciga, Guanacaste (CR)

(73) Assignee: Intel Corporation, Santa Clara, CA (US)

( * ) Notice: Subject to any disclaimer, the term of this patent is extended or adjusted under 35 U.S.C. 154(b) by 272 days.

(21) Appl. No.: 18/373,537

(22) Filed: Sep. 27, 2023

(65) Prior Publication Data

US 2025/0107044 A1 Mar. 27, 2025

(51) Int. Cl.
*H05K 7/00* (2006.01)
*H05K 7/20* (2006.01)

(52) U.S. Cl.
CPC ..... *H05K 7/20381* (2013.01); *H05K 7/20209* (2013.01)

(58) Field of Classification Search
CPC .. H05K 7/20381; H05K 7/20209; H05K 7/00; G06F 1/206; G06F 1/20; H01L 23/34; H01L 23/427
USPC .......... 701/300
See application file for complete search history.

(56) References Cited

U.S. PATENT DOCUMENTS

| | | | | |
|---|---|---|---|---|
| 2016/0123637 | A1* | 5/2016 | Moreno | F25B 39/02 62/516 |
| 2022/0087053 | A1* | 3/2022 | Pan | F28F 13/187 |
| 2025/0199513 | A1* | 6/2025 | Belkin | G06F 1/206 |

* cited by examiner

*Primary Examiner* — Shardul D Patel
(74) *Attorney, Agent, or Firm* — Schwegman Lundberg & Woessner, P.A.

(57) ABSTRACT

Cooling provided by a thermal management system may be controlled actively to reduce or prevent entering a dry out state. The systems and methods described herein include monitoring temperature metrics and identifying or predicting the onset of a dry out state, and temperature modulation mechanism may be controlled to cause an increase in the temperature of the heat pipe or vapor chamber. By controlling a temperature modulation mechanism to increase the operating temperature, the viscosity of the liquid in the thermal management approach is decreased, which improves its capillary flow and return rate back to the evaporator. By leveraging this temperature-dependent behavior, this thermal control approach may restore cooling capacity by managing the thermal management approach temperature due to a dry out state, and reduce or minimize the computing device performance degradation associated with a dry out state.

20 Claims, 8 Drawing Sheets

PERFORMANCE IN TWO-PHASE COOLING SYSTEMS

BACKGROUND

Computing devices may use various devices to cool electronic components. Two-phase cooling devices may be used to cool electronic components, such as heat pipes or vapor chambers. These two-phase cooling devices may include an evaporator side placed next a heat source, which may use the phase change from liquid to vapor to remove heat from the heat source. The two-phase cooling devices also include a condensation side where vapor is converted back to liquid. Because these devices rely on this phase change of a fluid and rely on the capillary limit of the internal structures (e.g., liquid tubes), these two-phase cooling devices may enter in a "dry out" state where the evaporation rate exceeds the fluid return rate, degrading thermal performance. This dry out state may result in increased thermal resistance and higher junction temperatures, which may throttle performance of various electronic components. To avoid the dry out state, electronic device manufacturers often increase the size of these two-phase cooling devices, however this increases cost and thickness.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In the following description, cooling provided by the thermal management approaches may be controlled actively to reduce or prevent entering a dry out state. The thermal management approaches described herein include monitoring temperature metrics (e.g., thermal resistance, temperature slope changes) and identifying or predicting the onset of a dry out state. Once the dry out state onset is identified or predicted, a temperature modulation mechanism (e.g., cooling fan) may be controlled to cause an increase in the temperature of the heat pipe or vapor chamber within the thermal management approach. In an example, the temperature modulation mechanism includes a cooling fan, and the temperature increase is caused by lowering fan speed or reducing fan power input.

These approaches may be used to improve the performance of a computing device. By controlling a temperature modulation mechanism to increase the operating temperature, the viscosity of the liquid in the thermal management approach is decreased, which improves its capillary flow and return rate back to the evaporator. By leveraging this temperature-dependent behavior, these thermal management approaches may restore cooling capacity by managing the thermal management approach temperature due to a dry out state, and reduce or minimize the computing device performance degradation associated with a dry out state.

Figure 1:
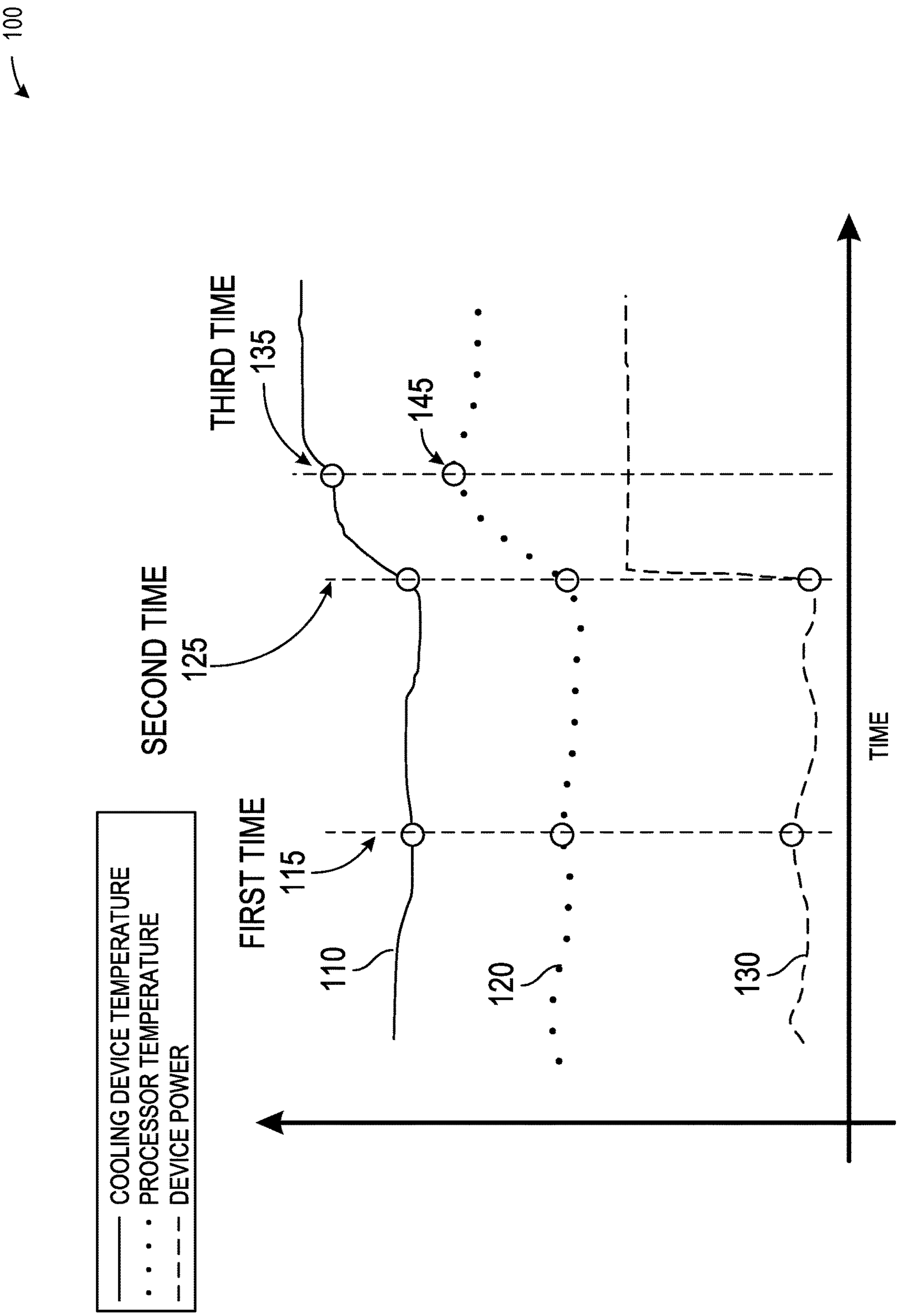
FIG. 1 is a graph of an example two-phase thermal system, according to an embodiment.

FIG. 1 is a graph 100 of an example two-phase thermal system, according to an embodiment. Graph 100 provides a graphical visualization of the thermal management techniques for preventing or mitigating heat pipe dry out events. The present subject matter centers on implementing a reactive thermal control approach that detects the onset of dry out in a thermal management approach, and in response to that detection, triggers one or more thermal management responses to reduce or minimize performance degradation.

Graph 100 shows the two-phase cooling device temperature 110, the processor temperature 120, and the device power 130 as a function of time. The device power 130 may reflect the power consumption of the chip package, such as a system-on-a-chip (SOC) that includes one or more processors. The processor temperature 120 may reflect the temperature of the one or more processors on the chip package. In various examples, the one or more processors may include a central processing unit (CPU), a graphic processing unit (GPU) a digital signal processor (DSP), a Field Programmable Gate Array (FPGA), an application specific integrated circuit (ASIC), a specialized x-processing unit (xPU) also known as a data processing unit (DPU), an infrastructure processing unit (IPU), or a network processing unit (NPU).

At first time 115, the device power 130 may be operating at a relatively steady state power level, and the two-phase cooling device temperature 110 and the processor temperature 120 may be maintained at a relatively steady temperature. At second time 125, the device power 130 may increase significantly, such as in response to a requested computing task. At second time 125, the two-phase cooling device temperature 110 and the processor temperature 120 may both increase. In an example, in response to these increases in temperature, a cooling fan associated with the two-phase cooling device may begin to operate at increased speeds to provide increased cooling.

The first stage of this thermal management approach involves predicting or detecting the onset of the thermal management approach entering a dry out state. This dry out state prediction or detection may be accomplished through various methods, such as monitoring temperature data provided by temperature sensors. The temperature sensors may include a temperature sensor associated with the two-phase cooling device, a temperature sensor associated with the processor, or other temperature sensor. In an example, the temperature sensor may be positioned to detect the temperature of the device to be cooled by the two-phase cooling device (e.g., the processor, the SOC that includes the processor), such as at the juncture between the processor and an integrated heat spreader (IHS) or thermal interface material (TIM) that thermally conducts heat from the processor to the two-phase cooling device.

One or more of these temperature sensors may be used to predict or detect the onset of the two-phase cooling device entering a dry out state. This prediction or detection may be based on monitoring a thermal resistance and identifying temperature increases, tracking changes in the slope of the two-phase cooling device temperature 110, or comparing the two-phase cooling device temperature 110 against known baseline behavior when dry out is not present.

Once the onset of a dry out state has been detected, such as at or before third time 135, the thermal control approach then initiates a thermal control response to reduce or minimize the effects of dry out on system performance. The thermal control response may include reducing the fan speed or temporarily disabling the fan. While reducing or disabling a fan may typically be associated with decreased cooling, such a thermal control response may decrease the viscosity of the fluid within the two-phase cooling device, thereby improving fluid flow and rate of return of the fluid to the evaporator. The thermal control approach may include other actions to reduce or minimize the effects of dry out, such as by triggering a reduction in power input to two-phase cooling device. As shown at third time 135, this may result in the two-phase cooling device temperature 110 increasing further. However, as shown at processor temperature point 145, the processor temperature 120 may decrease as a result of the improved cooling provided by the improved fluid flow within the two-phase cooling device. A flowchart of the operation of this thermal control approach is shown and described with respect to FIG. 2.

Figure 2:
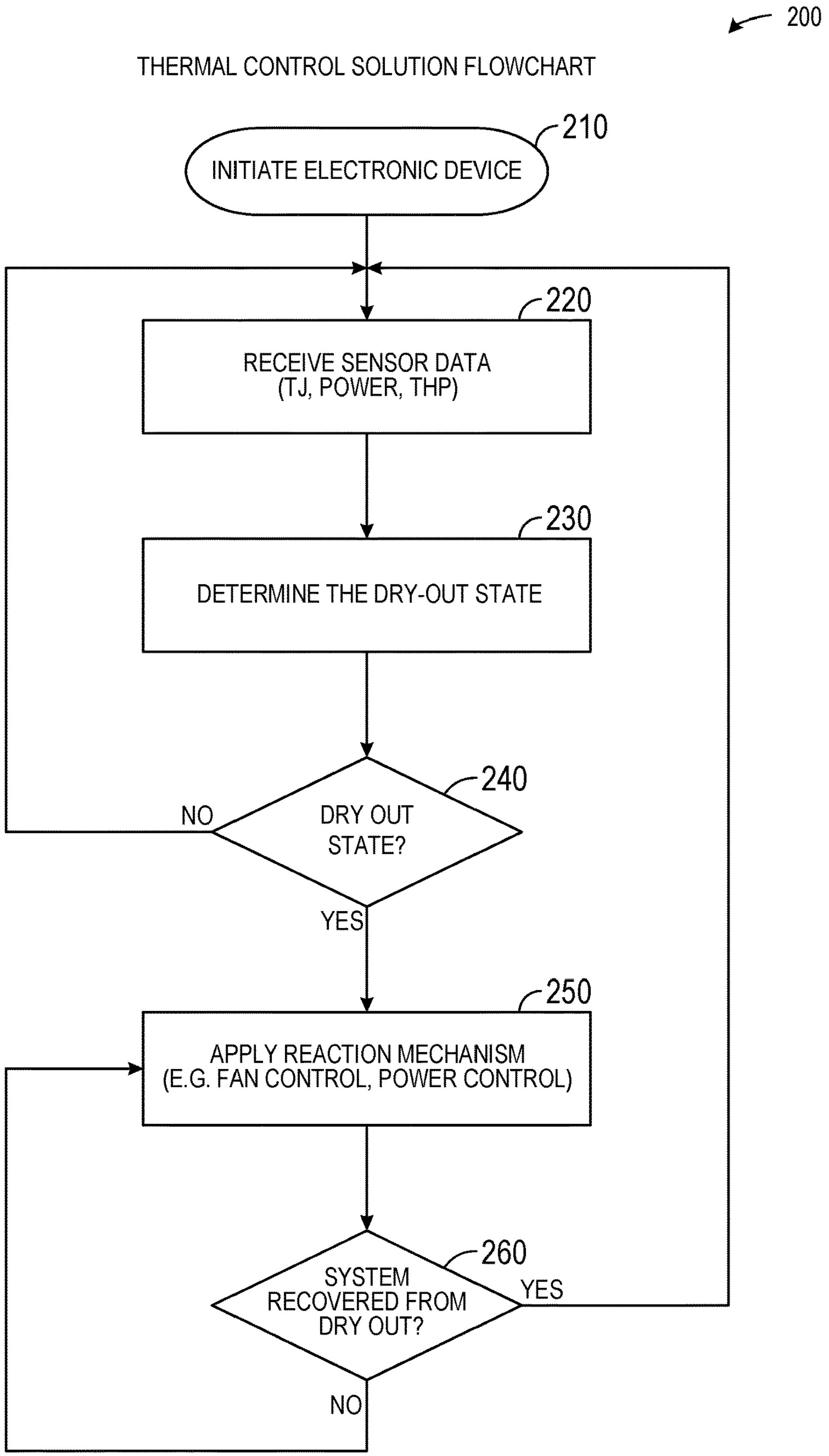
FIG. 2 illustrates a flowchart of the thermal control approach, according to an embodiment.

FIG. 2 illustrates a flowchart 200 of the thermal control approach, according to an embodiment. Following initiation of an electronic device 210 (e.g., providing power to a motherboard, providing power to an SOC), they system may receive sensor data 220 to predict or determine a dry out state. These sensor data sets may include the junction temperature (Tj), the power provided to the processor, and a thermal management device temperature $T_{TS}$. In an example, data sets associated with Tj and power may be available from existing software, from raw numerical temperature sensor data, or from lower-level programmed logic or a lower-level instruction set (e.g., assembly language, machine code). $T_{TS}$ may be measured directly, estimated via virtual sensors, predicted using an exponential weighted moving average (EWMA) of power and a baseline temperature point, or may be estimated or predicted using statistical techniques, artificial intelligence techniques, or other numerical estimation or prediction techniques.

These data sets may be used to predict or determine a dry out state 230. This determination may be based on monitoring thermal resistance ($psi_{j-hp}$). This may include taking the difference between Tj and $T_{TS}$, then dividing by the power input:

$$psi_{j-hp} = \frac{T_j - T_{TS}}{\text{Power}}$$

Monitoring thermal resistance $psi_{j-hp}$ allows dry out to be determined 230 based on characteristic increases in the value of $psi_{j-hp}$, such as when liquid replenishment at the evaporator becomes insufficient. An example of this insufficient liquid replenishment at the evaporator is shown and described with respect to FIG. 3.

In addition to monitoring thermal resistance, various other data sets or calculations may be used to predict or determine a dry out state 230. Additional techniques may include involve analyzing Tj slope changes, comparing Tj or slope values against baseline curves from normal operation, applying various statistical metrics, or other analysis.

If a dry out state 240 is not detected, the flowchart 200 may return to receive sensor data 220. If a dry out state 240 is detected, the flowchart 200 may proceed apply a thermal reaction mechanism 250. The thermal reaction mechanism 250 may include controlling fan speed, controlling fan power, controlling processor power limit, or other controls to increase the temperature of the two-phase cooling device.

Following application of the thermal reaction mechanism 250, the system may be analyzed to determine if it has recovered 260 from the dry out event. If the system has not yet recovered from the dry out event, the thermal reaction mechanism 250 may continue to be applied or may be adjusted to increase a thermal response. If the system has recovered from the dry out event, the thermal control approach is allowed to return to steady-state levels, and the system may return to receive sensor data 220.

Figure 3:
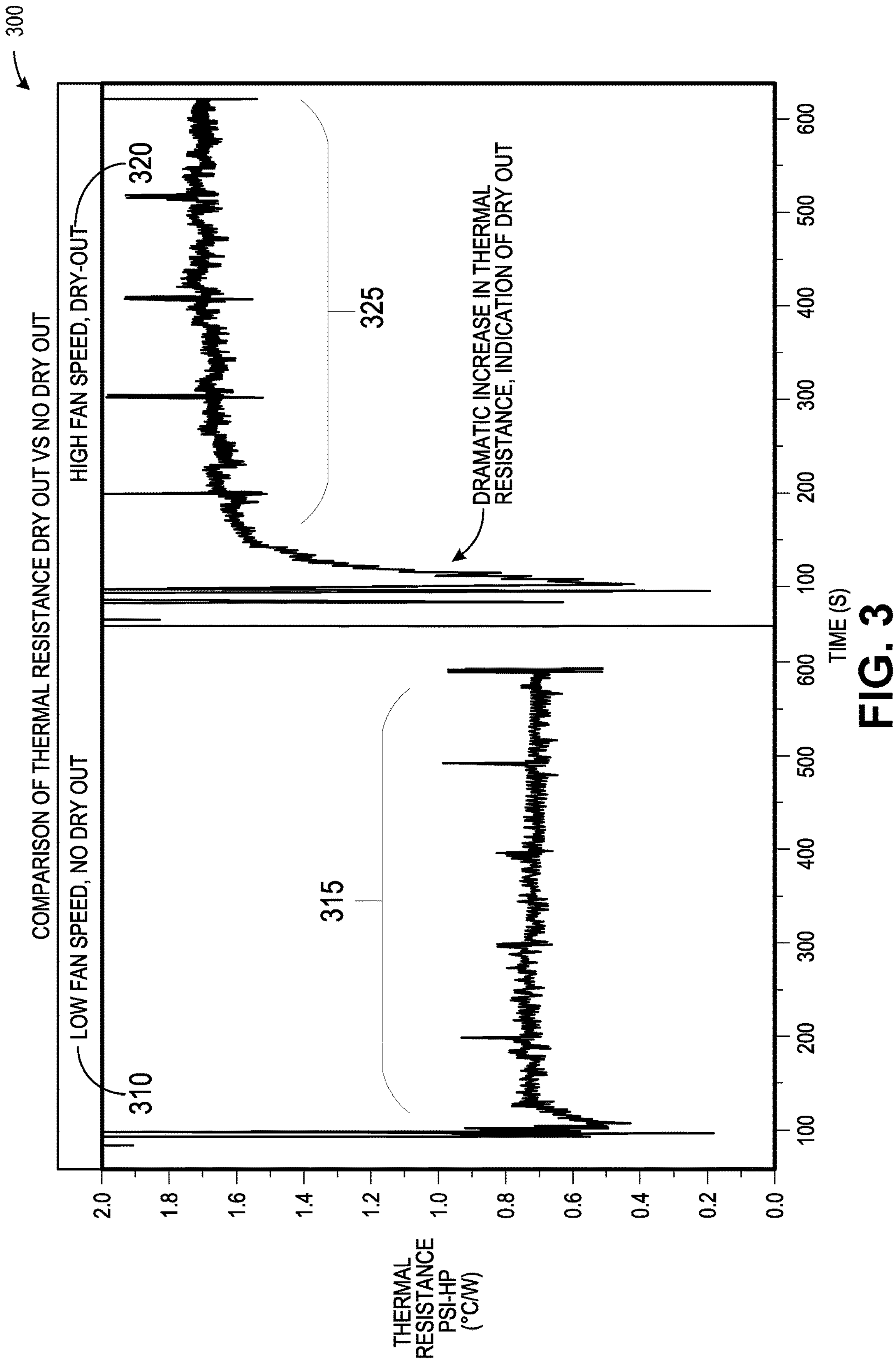
FIG. 3 illustrates a thermal resistance graph, according to an embodiment.

FIG. 3 illustrates a thermal resistance graph 300, according to an embodiment. The thermal resistance graph 300 shows thermal resistance $psi_{j-hp}$ as a function of time for a period with a lower fan speed and no dry out state 310 compared to a period with a higher fan speed and a dry out state 320. During the no dry out state 310, the no dry out thermal resistance 315 stays generally around 0.7° C./W, and stays generally lower than 0.8° C./W. In contrast, during a dry out state 320, there is a dramatic increase in the thermal resistance, more than doubling the dry out thermal resistance 325 to beyond 1.6° C./W.

These thermal resistance values may be used to predict or determine the onset of a dry out state for a two-phase cooling device. In an example, an analysis of the slope of the thermal resistance may be used to predict a significant increase in the thermal resistance and predict the onset of a dry out state, such as by identifying the slope in the dramatic increase of the dry out thermal resistance 325. In an example, a steady state threshold value or threshold range may be identified in no dry out thermal resistance 315, and values exceeding that threshold value or threshold range may be used to predict or identify a dry out onset. Various statistical techniques may be used in the data analysis, such as a moving window average or statistical outlier rejection to avoid false triggers due to outlier data points, such as the spikes shown on no dry out thermal resistance 315.

Figure 4:
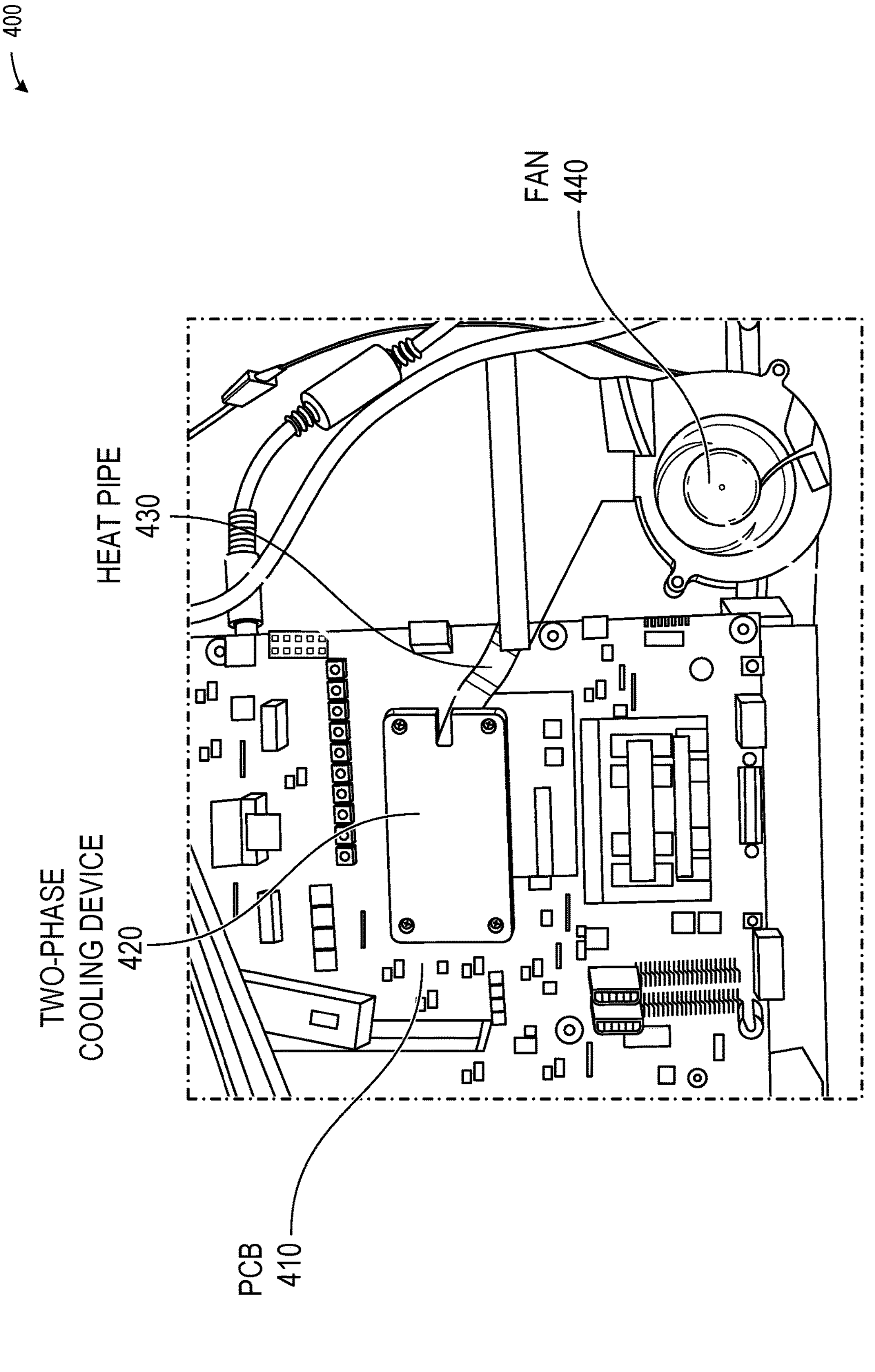
FIG. 4 illustrates a two-phase cooling system, according to an embodiment.

FIG. 4 illustrates a two-phase cooling system 400, according to an embodiment. The two-phase cooling system 400 includes a printed circuit board (PCB) 410 and a two-phase cooling device 420 positioned over a processor (not shown) mounted on the PCB 410. A heat pipe 430 couples the two-phase cooling device 420 to a heat exchanger and fan 440, where the speed of the fan 440 may be adjusted using a variable power supply or other fan speed control.

The two-phase cooling device 420 may include a heating device, or a heating device may be positioned on the two-phase cooling device 420 or the PCB 410 to provide heating to the two-phase cooling device 420. The heating device may include at least one of a resistive heater, a ceramic heater, a Kapton heater, a cartridge heater, a printed circuit board heater, an induction heater, a thermoelectric cooler, or another heating device. Resistive wire elements may be used to generate controlled heat. Ceramic and Kapton foil heaters may provide localized and rapid heating in a small area. Flexible silicone rubber heaters may be used to provide uniform heating over large or irregular component surfaces. Replaceable cartridge and PCB heaters may be used to provide heating based on specific geometric patterns, such as around the perimeter of the two-phase cooling device 420. Induction heaters may be used to generate precise heat directly within metallic components through electromagnetic fields.

Though typically used for cooling applications, a thermoelectric cooler (TEC) may also be used to provide precision heating for the two-phase cooling device 420. This heating may be applied by reversing the polarity of the direct current (DC) current applied to the TEC. Instead of the TEC pumping heat from the component side to the heat sink side, reversing the polarity causes the TEC to transfer heat in the opposite direction from the heat sink side to the component side, and the component side absorbs heat from the TEC. In this configuration, a heat sink, the fan 440, or other cooling mechanism may dissipate the heat. A temperature sensor and controller may be used to regulate the amount of heating provided by the TEC to provide selective and controllable heating of the two-phase cooling device 420.

To predict or determine the onset of the dry out state, one or more types of temperature sensors may be positioned on the PCB 410 or near the two-phase cooling device 420 to monitor temperature values and generate temperature data sets. On-die integrated circuit sensors may be used to provide direct internal chip temperature measurements, such as measuring the temperature of various integrated circuits on the PCB 410. Resistive thermistors may be placed on processors (e.g., CPU, graphical processing unit (GPU)), such as on the processor below the two-phase cooling device 420 to monitor local temperatures based on resistance changes. Thermocouples made from dissimilar metals generate voltages proportional to temperature differences, and may be used to monitor hot spots on the processor on the PCB 410. Infrared thermal imaging may be used to measure surface temperatures of various components of the two-phase cooling system 400. Thermistor or thermocouple probes may monitor intake air temperatures inside the housing containing the two-phase cooling system 400.

Figure 5:
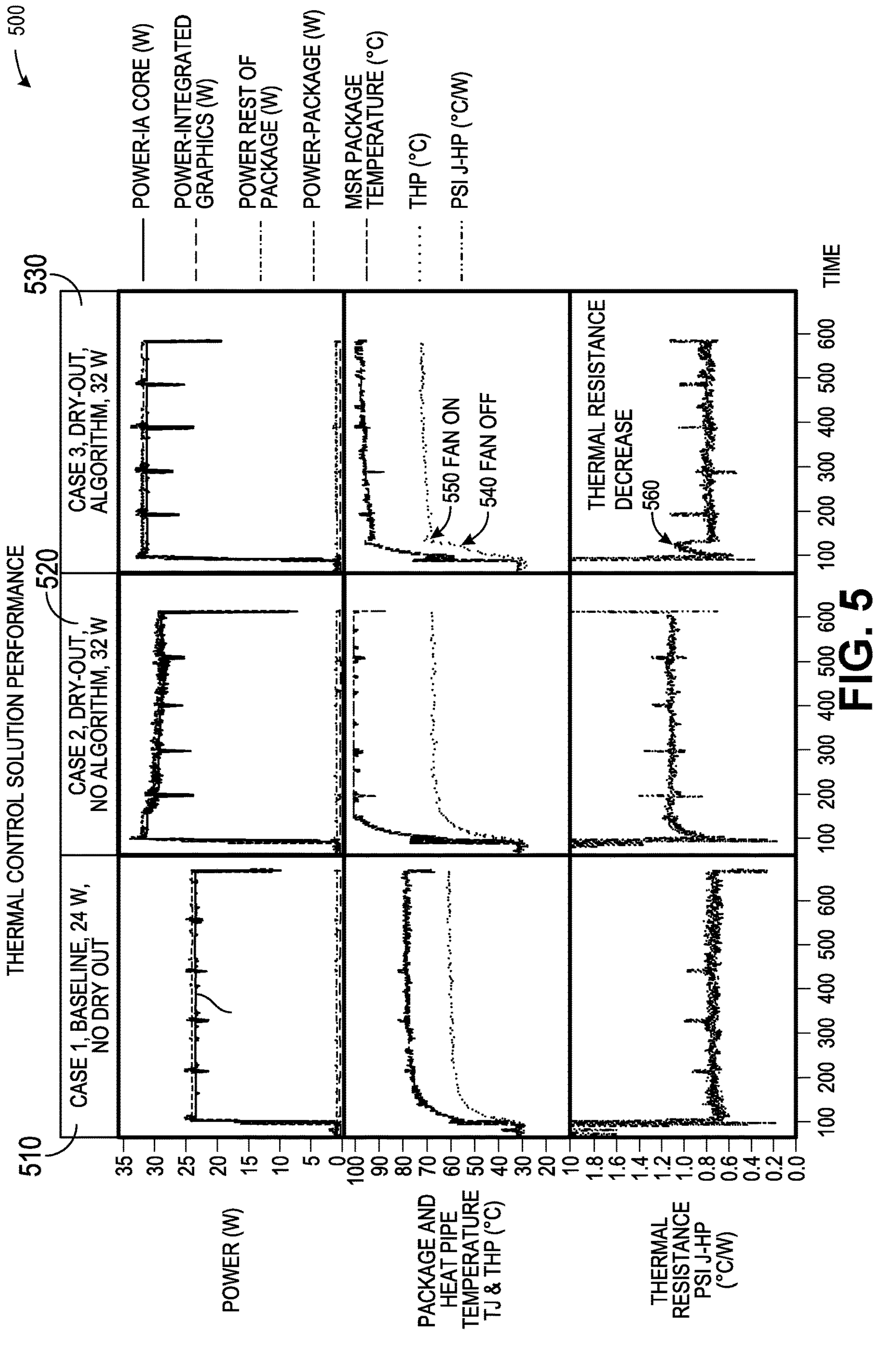
FIG. 5 shows a set of thermal control environmental metrics graphs, according to an embodiment.

FIG. 5 shows a set of thermal control environmental metrics graphs 500, according to an embodiment. Graphs 500 show power, temperature, and thermal resistance for each of three cases: Case 1 510 showing the baseline or control performance, Case 2 520 showing a dry out state with no thermal control applied, and Case 3 530 showing a dry out state with the thermal control applied. These three cases are summarized in Table 1 below:

TABLE 1

Example Configurations Demonstrating the Thermal control approach

| Case number | Description | CPU power (W) | PSU fan voltage (V) |
|---|---|---|---|
| Case 1 | Baseline/Control | 24 | 4.25 |
| Case 2 | Dry Out - no thermal control approach | 32 | 4.25 |
| Case 3 | Dry Out - thermal control approach used | 32 | 4.25 -> 10 s off |

Case 1 510 includes a baseline case with a CPU power of 24 W, which represents a case with a relatively constant fan speed and no dry out state (e.g., the evaporation rate in the two-phase cooling device has not exceeded the fluid return rate). By avoiding the dry out state in Case 1 510, the two-phase cooling device is able provide adequate cooling to the processor, though lower performance is still expected from Case 1 510 because of the relatively lower power consumption. However, Case 1 510 provides a reference for the resistance of the thermal management device, and provides a good baseline for comparison against other example configurations in Case 2 520 and Case 3 530. Case 1 510 may represent the case where an original equipment manufacturer (OEM) or original design manufacturer (ODM) does not push the platform boundaries and sets the processing or power consumption limit of the platform at a lower value to prevent dry-out at the cost of significantly reduced performance.

Case 2 520 includes the dry-out state but does not apply the thermal control approach. Case 2 520 includes a 32 W CPU power, and the fan speed is controlled to remain constant and equal to the fan speed in Case 1 510. Case 3 530 also includes 32 W CPU power, however the fan control is used to modify the cooling of the two-phase cooling device. In Case 3 530, when the dry out state is detected, the fan power supply unit (PSU) is stopped at fan off event 540, and is turned back on ten seconds later at fan on event 550. In response to the fan off event 540, there is a thermal resistance decrease 560, which results in the thermal resistance values in Case 3 530 approximating the values of the thermal resistance values in Case 1 510. By providing this reduced thermal resistance, the thermal control approach may be used to provide improved two-phase cooling device performance while providing improved processor performance. An example of this improved performance is shown and described with respect to FIG. 6.

Figure 6:
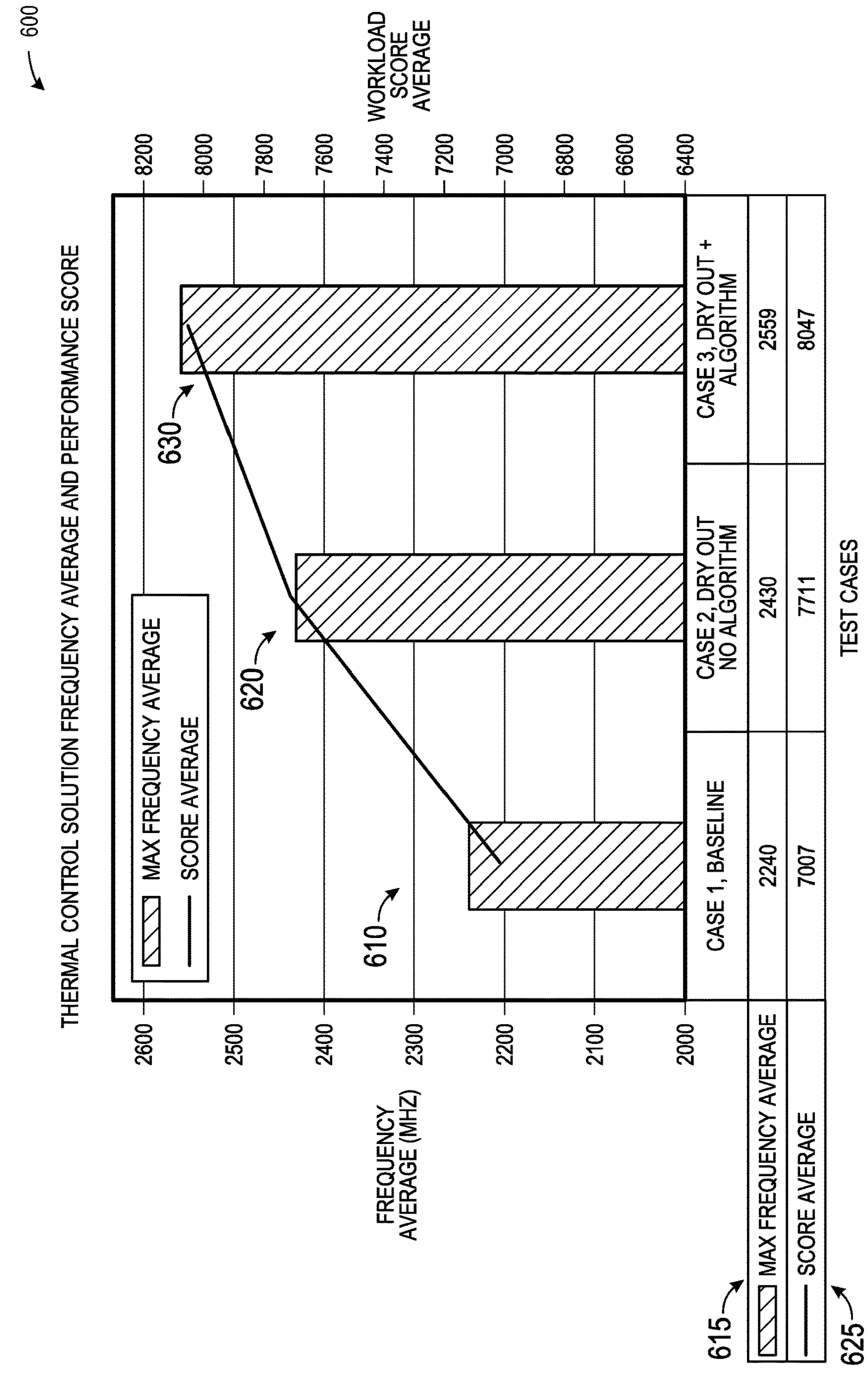
FIG. 6 shows a set of thermal control performance graphs, according to an embodiment.

FIG. 6 shows a set of thermal control performance graphs 600, according to an embodiment. Graphs 600 show the maximum frequency average 615 and a workload benchmark score average 625 for Case 1 610, Case 2 620, and Case 3 630. As shown in Case 3 630, when the thermal control approach is applied, there is a 129 MHz increase in average frequency, representing an improvement over Case 2 620 of over one 100 MHz bin. Additionally, the thermal control approach in Case 3 630 yielded a 4.4% boost in the workload benchmark score average 625 compared to the unmitigated dry out trial in Case 1 610. The performance benefits shown in Case 3 630 demonstrate the significant performance benefits provided by responding to dry out events in real-time to maintain proper thermal control. By leveraging brief timed fan speed changes, the present techniques may counteract the fluid flow deficiencies associated with dry out and allow the processor to maintain a higher maximum frequency average 615 and higher workload benchmark score average 625.

Figure 7:
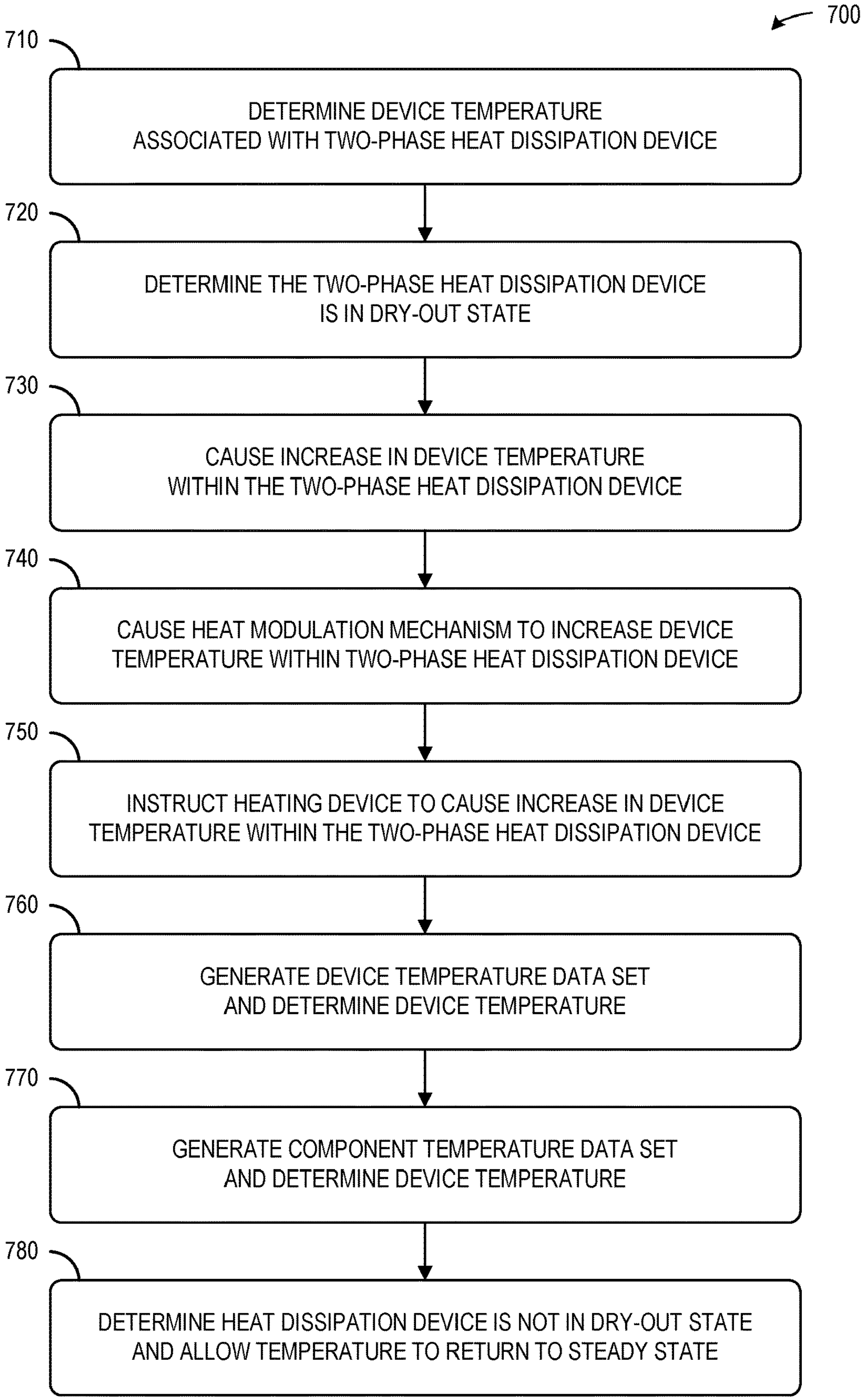
FIG. 7 is an example of a method for network function execution, according to an embodiment.

FIG. 7 is an example of a method 700 for network function execution, according to an embodiment. The operations of the method 700 are implemented in computing hardware, such as that described above in FIGS. 1-6, or below in FIG. 8 (e.g., processing circuitry). Method 700 includes determining 710, by a processing unit, a device temperature associated with a two-phase heat dissipation device, the two-phase heat dissipation device thermally connected to an integrated circuit device. Method 700 further includes determining 720, by the processing unit based on the device temperature, that the two-phase heat dissipation device is in a dry-out state. In response to detecting the two-phase heat dissipation device is in the dry-out state, method 700 further includes causing 730, by the processing unit, an increase in the device temperature within the two-phase heat dissipation device to improve a cooling performance of the two-phase heat dissipation device.

In an example, the two-phase heat dissipation device includes a fluid. Increasing the device temperature of the fluid may decrease a viscosity associated with the fluid. Additionally, decreasing the viscosity of the fluid may improve an ability of the two-phase heat dissipation device to cool the integrated circuit device.

Method 700 may further include causing 740 a heat modulation mechanism to increase the device temperature within the two-phase heat dissipation device. The heat modulation mechanism may include a cooling fan, and the processing unit reduces at least one of a fan speed or a fan duty cycle to cause the increase in the device temperature within the two-phase heat dissipation device. The integrated circuit device may include a processor, and the heat modulation mechanism may include power control logic configured to reduce power provided to the processor. The heat modulation mechanism may include a heating device associated with the two-phase heat dissipation device, and method 700 may further include instructing 750, by the processing unit, the heating device to cause the increase in the device temperature within the two-phase heat dissipation device. The heating device may include at least one of a thermoelectric cooler, a resistive heater, a ceramic heater, a Kapton heater, a cartridge heater, a printed circuit board heater, or an induction heater.

Method 700 may further include generating 760 a device temperature data set associated with the two-phase heat dissipation device and determining the device temperature based on the device temperature data set. The device temperature data set may be generated by a heat dissipation device temperature sensor. Method 700 may further include generating 770 a component temperature data set associated with a system component other than the two-phase heat dissipation device and determining the device temperature based on the component temperature data set. The component temperature data set may be generated 770 by a component temperature sensor. The component temperature sensor may be integrated into the integrated circuit device. Method 700 may further include determining 780 that the two-phase heat dissipation device is no longer experiencing the dry-out state and allowing the device temperature within the two-phase heat dissipation device to return to a steady state temperature.

Figure 8:
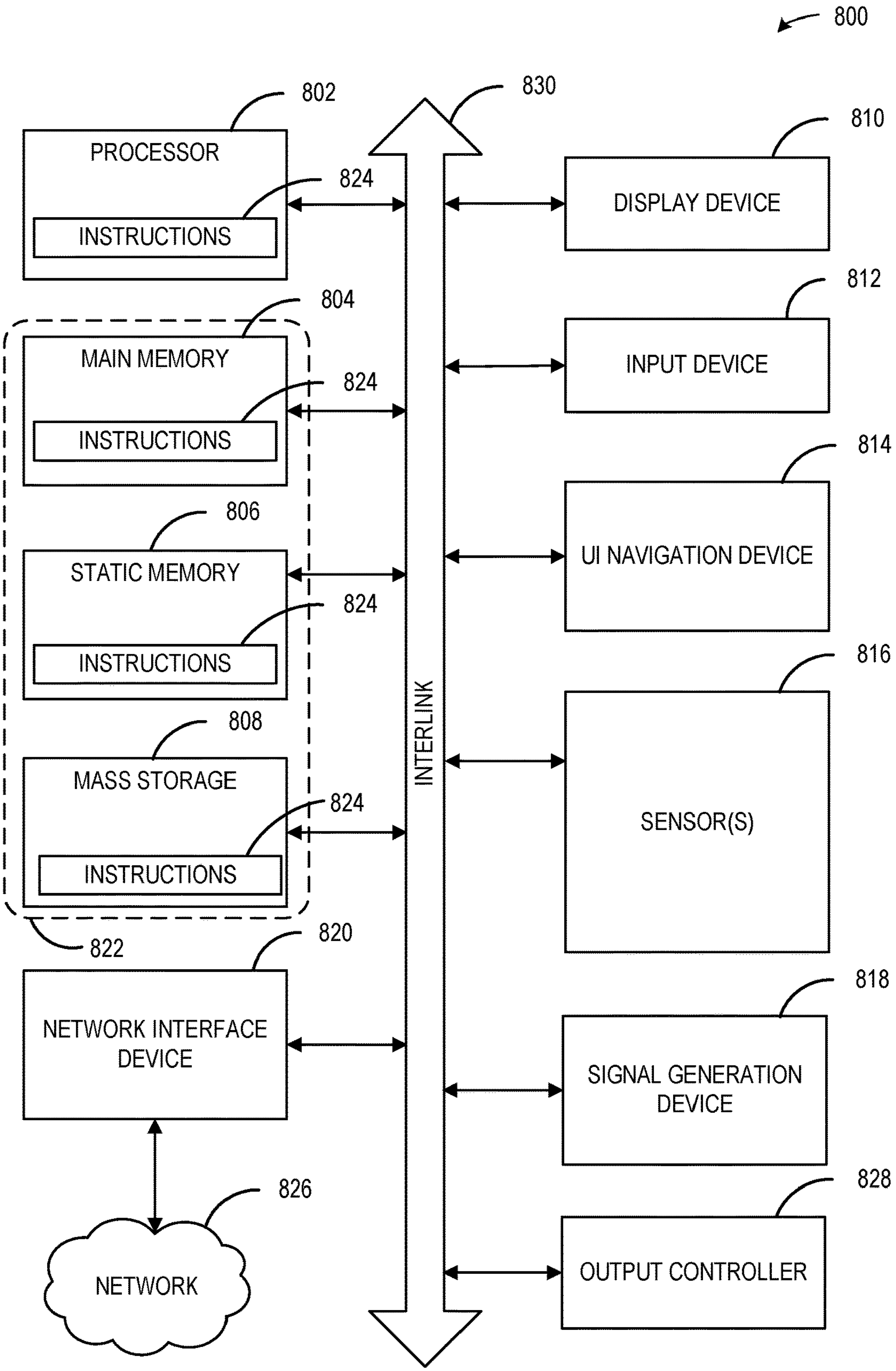
FIG. 8 illustrates a block diagram of an example machine upon which any one or more of the techniques discussed herein may perform.

FIG. 8 illustrates a block diagram of an example machine 800 upon which any one or more of the techniques (e.g., methodologies) discussed herein may perform. Machine 800 may be used to perform the operations described herein or to control industrial manufacturing equipment to perform the operations described herein. Examples, as described herein, may include, or may operate by, logic or several components, or mechanisms in the machine 800. Circuitry (e.g., processing circuitry) is a collection of circuits implemented in tangible entities of the machine 800 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 800 follow.

In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 800 may include a hardware processor 802 (e.g., a central processing unit (CPU), a graphics processing unit (GPU), a hardware processor core, or any combination thereof), a main memory 804, a static memory (e.g., memory or storage for firmware, microcode, a basic-input-output (BIOS), unified extensible firmware interface (UEFI), etc.) 806, and mass storage 808 (e.g., hard drive, tape drive, flash storage, or other block devices) some or all of which may communicate with each other via an interlink (e.g., bus) 830. The machine 800 may further include a display unit 810, an alphanumeric input device 812 (e.g., a keyboard), and a user interface (UI) navigation device 814 (e.g., a mouse). In an example, the display unit 810, input device 812 and UI navigation device 814 may be a touch screen display. The machine 800 may additionally include a storage device (e.g., drive unit) 808, a signal generation device 818 (e.g., a speaker), a network interface device 820, and one or more sensors 816, such as a global positioning system (GPS) sensor, compass, accelerometer, or another sensor. The machine 800 may include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 802, the main memory 804, the static memory 806, or the mass storage 808 may be, or include, a machine-readable medium 822 on which is stored one or more sets of data structures or instructions 824 (e.g., software) embodying or used by any one or more of the techniques or functions described herein. The instructions 824 may also reside, completely or at least partially, within any of registers of the processor 802, the main memory 804, the static memory 806, or the mass storage 808 during execution thereof by the machine 800. In an example, one or any combination of the hardware processor 802, the main memory 804, the static memory 806, or the mass storage 808 may constitute the machine-readable media 822. While the machine-readable medium 822 is illustrated as a single medium, the term "machine-readable medium" may include a single medium or multiple media (e.g., a centralized or distributed database, and/or associated caches and servers) configured to store the one or more instructions 824.

The term "machine-readable medium" may include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine-readable medium examples may include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine-readable media that do not include transitory propagating signals. Specific examples of non-transitory machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 824 may be further transmitted or received over a communications network 826 using a transmission medium via the network interface device 820 utilizing any one of several transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, 3GPP 4G or 5G networks), IEEE 802.15.4 family of standards, peer-to-peer (P2P) networks, among others. In an example, the network interface device 820 may include one or more physical jacks (e.g., Ethernet, coaxial, or phone jacks) or one or more antennas to connect to the communications network 826. In an example, the network interface device 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software. A transmission medium is a machine-readable medium.

Example 1 is an apparatus comprising: a two-phase heat dissipation device thermally connected to an integrated circuit device; and a processing unit configured to: determine a device temperature associated with the two-phase heat dissipation device; determine, based on the device temperature, that the two-phase heat dissipation device is in a dry-out state; and upon detecting the two-phase heat dissipation device is in the dry-out state, cause an increase in the device temperature within the two-phase heat dissipation device.

In Example 2, the subject matter of Example 1 includes wherein: the two-phase heat dissipation device includes a fluid; causing the increase in the device temperature of the fluid causes a decrease of a viscosity associated with the fluid; and decreasing the viscosity associated with the fluid causes an improvement in an ability of the two-phase heat dissipation device to cool the integrated circuit device.

In Example 3, the subject matter of Examples 1-2 includes the apparatus further including a heat modulation device to increase the device temperature within the two-phase heat dissipation device.

In Example 4, the subject matter of Example 3 includes wherein: the heat modulation device includes a cooling fan, and the processing unit is configured to reduce at least one of a fan speed or a fan duty cycle to cause the increase in the device temperature within the two-phase heat dissipation device.

In Example 5, the subject matter of Examples 3-4 includes wherein: the integrated circuit device includes a processor; and the heat modulation device includes power control logic configured to reduce power provided to the processor.

In Example 6, the subject matter of Examples 3-5 includes wherein: the heat modulation device includes a heating device; and the processing unit is configured to cause the heating device to cause the increase in the device temperature within the two-phase heat dissipation device.

In Example 7, the subject matter of Example 6 includes wherein the heating device includes at least one of a resistive heater, a ceramic heater, a Kapton heater, a cartridge heater, a printed circuit board heater, or an induction heater.

In Example 8, the subject matter of Examples 3-7 includes wherein: the heat modulation device includes a thermoelectric cooler; and the processing unit is configured to cause the thermoelectric cooler to cause the increase in the device temperature within the two-phase heat dissipation device.

In Example 9, the subject matter of Examples 1-8 includes the apparatus further including a heat dissipation device temperature sensor configured to generate device temperature data associated with the two-phase heat dissipation device; wherein the processing unit is further configured to determine the device temperature based on the device temperature data.

In Example 10, the subject matter of Example 9 includes the apparatus further including a component temperature sensor configured to generate component temperature data associated with a system component other than the two-phase heat dissipation device; wherein the processing unit is further configured to determine the device temperature based on the component temperature data.

In Example 11, the subject matter of Example 10 includes wherein the component temperature sensor is integrated into the integrated circuit device.

In Example 12, the subject matter of Examples 1-11 includes wherein the processing unit is further configured to: determine that the two-phase heat dissipation device is no longer experiencing the dry-out state; and cause the device temperature within the two-phase heat dissipation device to return to a steady state temperature.

Example 13 is a method comprising: determining, by a processing unit, a device temperature associated with a two-phase heat dissipation device, the two-phase heat dissipation device thermally connected to an integrated circuit device; determining, by the processing unit based on the device temperature, that the two-phase heat dissipation device is in a dry-out state; and in response to detecting the two-phase heat dissipation device is in the dry-out state, causing, by the processing unit, an increase in the device temperature within the two-phase heat dissipation device.

In Example 14, the subject matter of Example 13 includes wherein: the two-phase heat dissipation device includes a fluid; increasing the device temperature of the fluid causes a decrease of a viscosity associated with the fluid; and decreasing the viscosity associated with the fluid causes an improvement in an ability of the two-phase heat dissipation device to cool the integrated circuit device.

In Example 15, the subject matter of Examples 13-14 includes causing a heat modulation device to increase the device temperature within the two-phase heat dissipation device.

In Example 16, the subject matter of Example 15 includes wherein the heat modulation device includes a cooling fan, and the method further includes reducing at least one of a fan speed or a fan duty cycle to cause the increase in the device temperature within the two-phase heat dissipation device.

In Example 17, the subject matter of Examples 15-16 includes wherein the integrated circuit device includes a processor; and the heat modulation device includes power control logic configured to reduce power provided to the processor.

In Example 18, the subject matter of Examples 15-17 includes wherein the heat modulation device includes a heating device, and the method further includes instructing the heating device to cause the increase in the device temperature within the two-phase heat dissipation device.

In Example 19, the subject matter of Example 18 includes wherein the heating device includes at least one of a resistive heater, a ceramic heater, a Kapton heater, a cartridge heater, a printed circuit board heater, or an induction heater.

In Example 20, the subject matter of Examples 15-19 includes wherein the heat modulation device includes a thermoelectric cooler, and the method further includes instructing the thermoelectric cooler to cause the increase in the device temperature within the two-phase heat dissipation device.

In Example 21, the subject matter of Examples 13-20 includes generating, by a heat dissipation device temperature sensor, device temperature data associated with the two-phase heat dissipation device; and determining, by the processing unit, the device temperature based on the device temperature data.

In Example 22, the subject matter of Example 21 includes generating, by a component temperature sensor, component temperature data associated with a system component other than the two-phase heat dissipation device; and determining, by the processing unit, the device temperature based on the component temperature data.

In Example 23, the subject matter of Example 22 includes wherein the component temperature sensor is integrated into the integrated circuit device.

In Example 24, the subject matter of Examples 13-23 includes determining, by the processing unit, that the two-phase heat dissipation device is no longer experiencing the dry-out state; and causing, by the processing unit, the device temperature within the two-phase heat dissipation device to return to a steady state temperature.

Example 25 is a non-transitory machine-readable storage medium comprising instructions that, when executed by a processing unit, cause the processing unit to: determine, by a processing unit, a device temperature associated with a two-phase heat dissipation device, the two-phase heat dissipation device thermally connected to an integrated circuit device; determine, by the processing unit based on the device temperature, that the two-phase heat dissipation device is in a dry-out state; and in response to detecting the two-phase heat dissipation device is in the dry-out state, cause, by the processing unit, an increase in the device temperature within the two-phase heat dissipation device.

In Example 26, the subject matter of Example 25 includes wherein: the two-phase heat dissipation device includes a fluid; increasing the device temperature of the fluid causes a decrease of a viscosity associated with the fluid; and decreasing the viscosity associated with the fluid causes an improvement in an ability of the two-phase heat dissipation device to cool the integrated circuit device.

In Example 27, the subject matter of Examples 25-26 includes the instructions further causing the processing unit to cause a heat modulation device to increase the device temperature within the two-phase heat dissipation device.

In Example 28, the subject matter of Example 27 includes wherein: the heat modulation device includes a cooling fan; and the processing unit reduces at least one of a fan speed or a fan duty cycle to cause the increase in the device temperature within the two-phase heat dissipation device.

In Example 29, the subject matter of Examples 27-28 includes wherein: the integrated circuit device includes a processor; and the heat modulation device includes power control logic configured to reduce power provided to the processor.

In Example 30, the subject matter of Examples 27-29 includes wherein: the heat modulation device includes a heating device; and the instructions further causing the processing unit to instruct the heating device to cause the increase in the device temperature within the two-phase heat dissipation device.

In Example 31, the subject matter of Example 30 includes wherein the heating device includes at least one of a resistive heater, a ceramic heater, a Kapton heater, a cartridge heater, a printed circuit board heater, or an induction heater.

In Example 32, the subject matter of Examples 27-31 includes wherein the heat modulation device includes a thermoelectric cooler, and the instructions further cause the processing unit to instruct the thermoelectric cooler to cause the increase in the device temperature within the two-phase heat dissipation device.

In Example 33, the subject matter of Examples 25-32 includes the instructions further causing the processing unit to: generate, by a heat dissipation device temperature sensor, device temperature data associated with the two-phase heat dissipation device; and determine, by the processing unit, the device temperature based on the device temperature data.

In Example 34, the subject matter of Example 33 includes the instructions further causing the processing unit to: generate, by a component temperature sensor, component temperature data associated with a system component other than the two-phase heat dissipation device; and determine, by the processing unit, the device temperature based on the component temperature data.

In Example 35, the subject matter of Example 34 includes wherein the component temperature sensor is integrated into the integrated circuit device.

In Example 36, the subject matter of Examples 25-35 includes the instructions further causing the processing unit to: determine, by the processing unit, that the two-phase heat dissipation device is no longer experiencing the dry-out state; and cause, by the processing unit, the device temperature within the two-phase heat dissipation device to return to a steady state temperature.

Example 37 is an apparatus comprising: means for determining a device temperature associated with a two-phase heat dissipation device, the two-phase heat dissipation device thermally connected to an integrated circuit device; means for determining, based on the device temperature, that the two-phase heat dissipation device is in a dry-out state; and means for, in response to detecting the two-phase heat dissipation device is in the dry-out state, causing an increase in the device temperature within the two-phase heat dissipation device.

In Example 38, the subject matter of Example 37 includes wherein: the two-phase heat dissipation device includes a fluid; means for increasing the device temperature of the fluid causes a decrease of a viscosity associated with the fluid; and means for decreasing the viscosity associated with the fluid causes an improvement in an ability of the two-phase heat dissipation device to cool the integrated circuit device.

In Example 39, the subject matter of Examples 37-38 includes means for causing a heat modulation device to increase the device temperature within the two-phase heat dissipation device.

In Example 40, the subject matter of Example 39 includes wherein: the heat modulation device includes a cooling fan; and the means for processing reduces at least one of a fan speed or a fan duty cycle to cause the increase in the device temperature within the two-phase heat dissipation device.

In Example 41, the subject matter of Examples 39-40 includes wherein: the integrated circuit device includes a processor; and the heat modulation device includes means for reducing power provided to the processor.

In Example 42, the subject matter of Examples 39-41 includes wherein the heat modulation device includes a heating device, and the apparatus further includes means for instructing the heating device to cause the increase in the device temperature within the two-phase heat dissipation device.

In Example 43, the subject matter of Example 42 includes wherein the heating device includes at least one of a resistive heater, a ceramic heater, a Kapton heater, a cartridge heater, a printed circuit board heater, or an induction heater.

In Example 44, the subject matter of Examples 39-43 includes wherein the heat modulation device includes a thermoelectric cooler, and the apparatus further includes means for instructing the thermoelectric cooler to cause the increase in the device temperature within the two-phase heat dissipation device.

In Example 45, the subject matter of Examples 37-44 includes means for generating device temperature data associated with the two-phase heat dissipation device; and means for determining the device temperature based on the device temperature data.

In Example 46, the subject matter of Example 45 includes means for generating component temperature data associated with a system component other than the two-phase heat dissipation device; and means for determining the device temperature based on the component temperature data.

In Example 47, the subject matter of Example 46 includes wherein the component temperature sensor is integrated into the integrated circuit device.

In Example 48, the subject matter of Examples 37-47 includes means for determining that the two-phase heat dissipation device is no longer experiencing the dry-out state; and means for causing the device temperature within the two-phase heat dissipation device to return to a steady state temperature.

Example 49 is at least one machine-readable medium including instructions that, when executed by processing circuitry, cause the processing circuitry to perform operations to implement of any of Examples 1-48.

Example 50 is an apparatus comprising means to implement of any of Examples 1-48.

Example 51 is a system to implement of any of Examples 1-48.

Example 52 is a method to implement of any of Examples 1-48.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

What is claimed is:

1. An apparatus comprising:

a two-phase heat dissipation device thermally connected to an integrated circuit device; and processor circuitry configured to:

determine a device temperature associated with the two-phase heat dissipation device; determine, based on the device temperature, that the two-phase heat dissipation device is in a dry-out state; and upon detecting the two-phase heat dissipation device is in the dry-out state, cause an increase in the device temperature within the two-phase heat dissipation device to counteract the dry-out state.

2. The apparatus of claim 1, wherein:

the two-phase heat dissipation device includes a fluid;

causing the increase in the device temperature of the fluid causes a decrease of a viscosity associated with the fluid; and decreasing the viscosity associated with the fluid causes an improvement in an ability of the two-phase heat dissipation device to cool the integrated circuit device.

3. The apparatus of claim 1, the apparatus further including a heat modulation device to increase the device temperature within the two-phase heat dissipation device.

4. The apparatus of claim 3, wherein:

the heat modulation device includes a cooling fan; and the processor circuitry is configured to reduce at least one of a fan speed or a fan duty cycle to cause the increase in the device temperature within the two-phase heat dissipation device.

5. The apparatus of claim 3, wherein:

the integrated circuit device includes a processor; and the heat modulation device includes power control logic configured to reduce power provided to the processor.

6. The apparatus of claim 3, wherein:

the heat modulation device includes a heating device; and the processor circuitry is configured to cause the heating device to cause the increase in the device temperature within the two-phase heat dissipation device.

7. The apparatus of claim 6, wherein the heating device includes at least one of a resistive heater, a ceramic heater, a Kapton heater, a cartridge heater, a printed circuit board heater, or an induction heater.

8. The apparatus of claim 3, wherein:

the heat modulation device includes a thermoelectric cooler; and the processor circuitry is configured to cause the thermoelectric cooler to cause the increase in the device temperature within the two-phase heat dissipation device.

9. The apparatus of claim 1, the apparatus further including a heat dissipation device temperature sensor configured to generate device temperature data associated with the two-phase heat dissipation device;

wherein the processor circuitry is further configured to determine the device temperature based on the device temperature data.

10. The apparatus of claim 9, the apparatus further including a component temperature sensor configured to generate component temperature data associated with a system component other than the two-phase heat dissipation device;

wherein the processor circuitry is further configured to determine the device temperature based on the component temperature data.

11. The apparatus of claim 10, wherein the component temperature sensor is integrated into the integrated circuit device.

12. The apparatus of claim 1, wherein the processor circuitry is further configured to:

determine that the two-phase heat dissipation device is no longer experiencing the dry-out state; and cause the device temperature within the two-phase heat dissipation device to return to a steady state temperature.

13. A non-transitory machine-readable storage medium comprising instructions that, when executed by a processor circuitry, cause the processor circuitry to:

determine, by a processor circuitry, a device temperature associated with a two-phase heat dissipation device, the two-phase heat dissipation device thermally connected to an integrated circuit device;

determine, by the processor circuitry based on the device temperature, that the two-phase heat dissipation device is in a dry-out state; and in response to detecting the two-phase heat dissipation device is in the dry-out state, cause, by the processor circuitry, an increase in the device temperature within the two-phase heat dissipation device to counteract the dry-out state.

14. The non-transitory machine-readable storage medium of claim 13, wherein:

the two-phase heat dissipation device includes a fluid;

increasing the device temperature of the fluid causes a decrease of a viscosity associated with the fluid; and decreasing the viscosity associated with the fluid causes an improvement in an ability of the two-phase heat dissipation device to cool the integrated circuit device.

15. The non-transitory machine-readable storage medium of claim 13, the instructions further causing the processor circuitry to cause a heat modulation device to increase the device temperature within the two-phase heat dissipation device.

16. An apparatus comprising:

means for determining a device temperature associated with a two-phase heat dissipation device, the two-phase heat dissipation device thermally connected to an integrated circuit device;

means for determining, based on the device temperature, that the two-phase heat dissipation device is in a dry-out state; and means for, in response to detecting the two-phase heat dissipation device is in the dry-out state, causing an increase in the device temperature within the two-phase heat dissipation device to counteract the dry-out state.

17. The apparatus of claim 16, wherein:

the two-phase heat dissipation device includes a fluid;

means for increasing the device temperature of the fluid causes a decrease of a viscosity associated with the fluid; and means for decreasing the viscosity associated with the fluid causes an improvement in an ability of the two-phase heat dissipation device to cool the integrated circuit device.

18. The apparatus of claim 16, further comprising means for causing a heat modulation device to increase the device temperature within the two-phase heat dissipation device.

19. The apparatus of claim 18, wherein:

the heat modulation device includes a cooling fan; and the means for processing reduces at least one of a fan speed or a fan duty cycle to cause the increase in the device temperature within the two-phase heat dissipation device.

20. The apparatus of claim 18, wherein:

the integrated circuit device includes a processor; and the heat modulation device includes means for reducing power provided to the processor.

* * * * *